United States Patent
Chua

(10) Patent No.: US 8,089,083 B2
(45) Date of Patent: Jan. 3, 2012

(54) SYSTEM AND METHOD FOR ENHANCING LIGHT EMISSIONS FROM LIGHT PACKAGES BY ADJUSTING THE INDEX OF REFRACTION AT THE SURFACE OF THE ENCAPSULATION MATERIAL

(75) Inventor: Janet Bee Yin Chua, Perak (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 511 days.

(21) Appl. No.: 11/403,266

(22) Filed: Apr. 13, 2006

(65) Prior Publication Data
US 2007/0241355 A1 Oct. 18, 2007

(51) Int. Cl.
*H01L 33/00* (2010.01)
(52) U.S. Cl. .................... 257/98; 257/100; 257/E33.001
(58) Field of Classification Search .................... 257/98, 257/100, E33.001
See application file for complete search history.

(56) References Cited

U.S. PATENT DOCUMENTS

| 7,157,745 | B2 * | 1/2007 | Blonder et al. | 257/98 |
| 2003/0214233 | A1 * | 11/2003 | Takahashi et al. | 313/512 |
| 2005/0274967 | A1 * | 12/2005 | Martin et al. | 257/98 |
| 2006/0255353 | A1 * | 11/2006 | Taskar et al. | 257/98 |

* cited by examiner

*Primary Examiner* — Cuong Q Nguyen
*Assistant Examiner* — Tran Tran

(57) ABSTRACT

Light emission from a light package, such as from an LED light package, is enhanced by a system and method for adjusting the refractive index at the surface of the encapsulating material surrounding the light source. The surface refractive index is changed to better match the index within the encapsulating material with the index of the media surrounding the encapsulating material. In one embodiment, the index is adjusted by roughing the surface of the encapsulating material. In another embodiment, a separate layer is created having a corrective index of refraction. The separate layer can comprise photonic crystals, if desired. In some embodiments the adjusting will achieve a graded index of refraction.

10 Claims, 2 Drawing Sheets

SYSTEM AND METHOD FOR ENHANCING LIGHT EMISSIONS FROM LIGHT PACKAGES BY ADJUSTING THE INDEX OF REFRACTION AT THE SURFACE OF THE ENCAPSULATION MATERIAL

TECHNICAL FIELD

This disclosure relates to increasing light emissions from light packages and more particularly to systems and methods for adjusting the index of refraction at the boundary of the light package encapsulation material.

BACKGROUND OF THE INVENTION

It is always desired to increase the light emission from light packages. Certain types of light packages are designed with an encapsulating material surrounding the light source and the ultimate light emitting surface. For example, in light emitting diode (LED) packages an LED chip is positioned within a cavity formed by the light package housing. Encapsulating material surrounding the LED chip acts as interface between the LED chip and the outside world.

In such a structure, the light from the light source, such as from the LED chip, must pass through the encapsulating material before it emerges into the outside world through, for example, the top (or outer) surface of the encapsulating material.

In the past, one method of achieving increased light output from LED packages was to place photonic crystals around the LED chip to enhance the light emitting into the encapsulating material. This method has proven effective but still light is lost as it passes through and emerges from the encapsulating material.

BRIEF SUMMARY OF THE INVENTION

Light emission from a light package, such as from an LED light package, is enhanced by a system and method for adjusting the refractive index at the surface of the encapsulating material surrounding the light source. The surface refractive index is changed to better match the index within the encapsulating material with the index of the media surrounding the encapsulating material. In one embodiment, the index is adjusted by roughing the surface of the encapsulating material. In another embodiment, a separate layer is created having a corrective index of refraction. The separate layer can comprise photonic crystals, if desired. In some embodiments the adjusting will achieve a graded index of refraction.

DETAILED DESCRIPTION OF THE INVENTION

Figure 1:
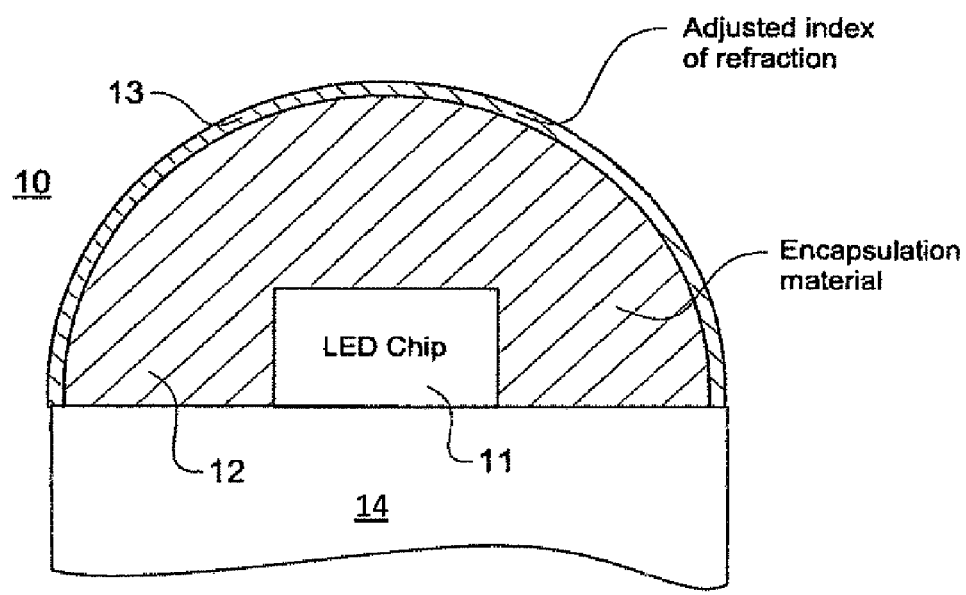
FIGS. 1, 2 and 3 show embodiments of light emitting packages having adjusted index of refractions at their respective encapsulation material surfaces.

FIG. 1 shows one embodiment of light package 10 having LED chip 11 surrounded by encapsulation material 12 having an adjusted index of refraction 13 positioned at a top surface of encapsulation material 12. The LED chip 11 is positioned on a housing 14. The purpose of the adjusted index of refraction at the surface of the encapsulation material is to assist in the propagation of light emitted from LED chip 11 out of the material so as to increase the light output from light source 10. The purpose of the adjustment to the index refraction is to insure a close refractive index match between the encapsulation material and the surrounding media, such as glass, air, etc. This adjustment or correction is accomplished by placing an index matching layer on or above the surface of the encapsulation material. The adjusted index serves to reduce the reflectance inside of the light cone by increasing the critical angle of total internal reflection (TIR). This procedure takes advantage of the fact that the highest light extraction values occur for materials with the same refractive index throughout. When a homogenous refractive index is not possible, then a graded index refraction is the next best thing.

Figure 2:
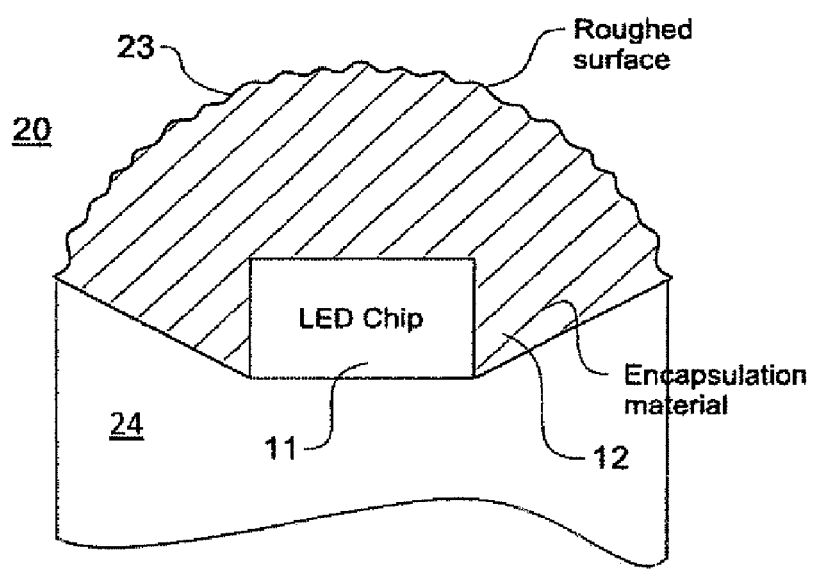

FIG. 2 shows light device 20 having roughed surface 23 to increase the index matching. In the embodiment shown in FIG. 2, the encapsulation material 12 surrounds the LED chip 11 that is positioned within the housing 24. By roughing the surface, there is an increased probability that the rays of light that approach the rough surface will have angles higher than the critical angle for TIR because of the particular microstructure at the surface where the light impacts.

Figure 3:
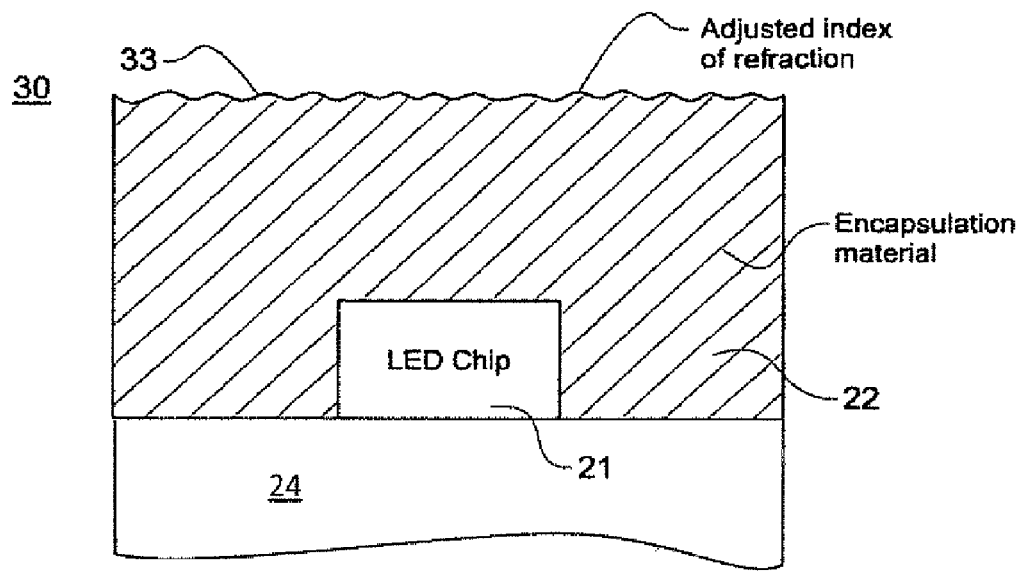
Figure 4:
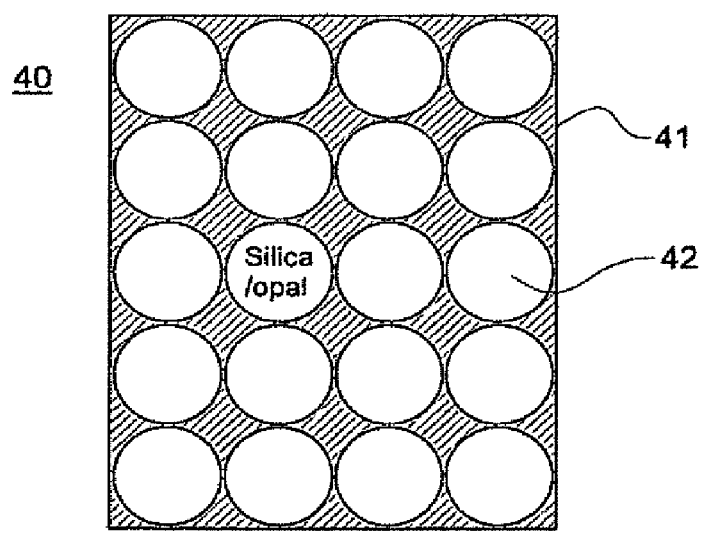
FIG. 4 shows one embodiment of a film for adjusting the index of refraction.

FIG. 3 shows light package 30 having a flat upper surface of encapsulation material 22 which has its surface 33 adjusted. This adjustment, for example, can be made by adding a layer as in FIG. 1 or by roughing as in FIG. 2 by using a film as shown in FIG. 4, or otherwise, for index of refraction. Similar to FIGS. 1 and 2, the LED chip 21 is positioned within the housing 24.

FIG. 4 shows one embodiment of a film, such as an opaline film prepared from poly (methyl methacrylate) (PMMA) colloids. Film 40 is effectively a film of photonic crystals that can be positioned on the surface of the encapsulant, such as encapsulant 12 (FIG. 1). Film 40 comprises a film base 41 which can be constructed having a nano-structured array of holes (or columns) used as an optical semi-conductor. Photonic crystals create photonic band gaps that confine light and can operate to increase the efficiency of optical transmission.

In the embodiment shown in FIG. 4, circular shapes 42 are constructed with silica or opal which is replaced by the phosphor particles. The silica or opal can be dissolved or otherwise removed. When the phosphor is placed in each column, the light that is emitted is trapped within the column and propagates out through the top of the channel yielding the maximum light produced by the phosphor such that there is little or no light leakage or light loss within the column.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light device comprising:
   a light source;

encapsulation material encapsulating said light source such that the surrounding of the light source is filled up by the encapsulation material;

an index of refraction matching layer positioned with respect to said encapsulation material so as to increase light extraction from said encapsulation material;

wherein, said index of refraction matching layer is a separate layer of material having a different index of refraction from that of said encapsulation material and wherein, the separate layer is a film layer;

wherein, said index of refraction matching layer is at least partially located between said encapsulation material and a media;

wherein, said encapsulation material has a first index of refraction;

wherein, said index of refraction matching layer has a second index of refraction;

wherein, said media has a third index of refraction;

wherein, said first index of refraction is different from said third index of refraction and said second index of refraction is between said first index of refraction and said third index of refraction; and wherein said film layer is an opaline film.

2. The light device of claim 1 wherein said opaline film is prepared from: poly(methacrylate) colloids.

3. The light device of claim 1 wherein said index of refraction matching layer is positioned on a top curved surface of said encapsulation material.

4. The light device of claim 1 wherein said index of refraction matching layer is positioned on a top flat surface of said encapsulation material.

5. The light device of claim 1 wherein said index of refraction matching layer comprises photonic crystals.

6. An LED package comprising:
a housing;
an LED chip positioned within said housing;
encapsulation material encapsulating said LED chip such that the surrounding of the LED chip is filled up by the encapsulation material, said encapsulation material having an outer surface through which light from said LED chip passes;

an index of refraction matching layer positioned at said outer surface of said encapsulation material;

wherein said index of refraction matching layer is a separate layer of material having a different index of refraction from that of said encapsulation material and wherein, the separate layer is a film layer;

wherein said index of refraction matching layer is at least partially located between said encapsulation material and a media;

wherein said encapsulation material has a first index of refraction;

wherein said index of refraction matching layer has a second index of refraction;

wherein said media has a third index of refraction;

wherein said first index of refraction is different from said third index of refraction and said second index of refraction is between said first index of refraction and said third index of refraction; and wherein said film layer is an opaline film.

7. The LED package of claim 6 wherein said opaline film is prepared from: poly(methacrylate) colloids.

8. The LED package of claim 6 wherein said index of refraction matching layer is positioned on a top curved surface of said encapsulation material.

9. The LED package of claim 6 wherein said index of retraction matching layer is positioned on a top flat surface of said encapsulation material.

10. The LED package of claim 6 wherein said index of retraction matching layer comprises photonic crystals.

* * * * *